(12) United States Patent
Chen et al.

(10) Patent No.: US 7,196,410 B2
(45) Date of Patent: Mar. 27, 2007

(54) WAFER PACKAGING AND SINGULATION METHOD

(75) Inventors: Chien-Hua Chen, Corvallis, OR (US); Bradley C. John, Sheridan, OR (US); Charlotte R. Lanig, Albany, OR (US); Melissa A. Workman, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/340,321

(22) Filed: Jan. 25, 2006

(65) Prior Publication Data

US 2006/0128064 A1    Jun. 15, 2006

Related U.S. Application Data

(62) Division of application No. 10/776,084, filed on Feb. 11, 2004, now Pat. No. 7,026,189.

(51) Int. Cl.
*H01L 23/12* (2006.01)
(52) U.S. Cl. .............................. 257/704; 257/E23.123; 257/E23.124; 257/E23.128
(58) Field of Classification Search ................ 257/704, 257/E23.123, E23.124, E23.128
See application file for complete search history.

(56) References Cited

U.S. PATENT DOCUMENTS

| 6,055,344 | A | 4/2000 | Fouquet et al. | |
| 6,465,355 | B1 | 10/2002 | Horsley | |
| 6,528,864 | B1 * | 3/2003 | Arai | 257/620 |
| 6,537,846 | B2 | 3/2003 | Lee et al. | |
| 6,583,524 | B2 | 6/2003 | Brandt | |
| 6,590,850 | B2 | 7/2003 | Eldredge et al. | |
| 6,600,201 | B2 | 7/2003 | Hartwell et al. | |
| 6,630,725 | B1 * | 10/2003 | Kuo et al. | 257/659 |
| 6,632,698 | B2 | 10/2003 | Ives | |
| 2002/0170175 | A1 | 11/2002 | Aigner et al. | |

OTHER PUBLICATIONS

IMAPS Advanced Technology Workshop on Packaging of MEMS and Related Micro Integrated Nano Systems, Workshop Presentations, Hilton San Jose South/Scotts Valley, Scotts Valley, CA, Nov. 8-10, 2001.

* cited by examiner

*Primary Examiner*—Trung Dang

(57) ABSTRACT

A multi-device lid for a micro device wafer has a plurality of micro devices. The multi-device lid includes a multi-lid substrate configured to cover the plurality of micro devices of the micro device wafer. The multi-lid substrate has a trench pattern with intersection portions and non-intersection portions on a first side of the multi-lid substrate. The trench pattern is configured such that the intersection portions of the trench pattern extend adjacent to at least two of the plurality of micro devices when the multi-lid substrate is coupled to the micro device wafer.

36 Claims, 3 Drawing Sheets

US 7,196,410 B2

WAFER PACKAGING AND SINGULATION METHOD

REFERENCE TO RELATED APPLICATIONS

This Application is a divisional of U.S. patent application Ser. No. 10/776,084, filed Feb. 11, 2004, now U.S. Pat. No. 7,026,189, now U.S. Pat. No. 7,026,189 herein incorporated by reference.

BACKGROUND OF THE INVENTION

Micro components or micro devices generally refer to either electronic components or machines with dimensions in the order of micrometers. Micro electronics generally relates to electronic circuitry or integrated circuits formed on silicon chips, such as transistors. Micro machines generally refer to micro engineered devices having moving parts. Micro machines are also commonly known as micro-electromechanical systems (MEMS). Micro machines are commonly used in accelerometers, pressure sensors, actuators, fluidic devices, biomechanical devices and other miniature machines. Many micro systems include both micro electronics and micro machines.

Due to their small size, micro devices are commonly packaged with a lid or protective coating. Because micro machines by nature include one or more moving parts, micro machines are especially vulnerable to damage from the environment. Many micro machines are surrounded by a hermetic seal. Communication with the sealed micro machine is typically achieved via one or more electrical contact points or contact pads projecting beyond the seal.

Due to their small size, multiple micro devices are typically formed together on a single common substrate such as a silicon wafer. Fabricating multiple micro devices on a single wafer reduces fabrication costs. However, the packaging of multiple micro devices while still part of a wafer and later singulating the wafer into a plurality of dies containing individual micro devices is typically complex, tedious and expensive. With present techniques, is extremely difficult to effectively seal each micro device yet expose contact points or pads of each device while the device is still part of a wafer.

DETAILED DESCRIPTION OF AN EXAMPLE EMBODIMENT

Figure 1:
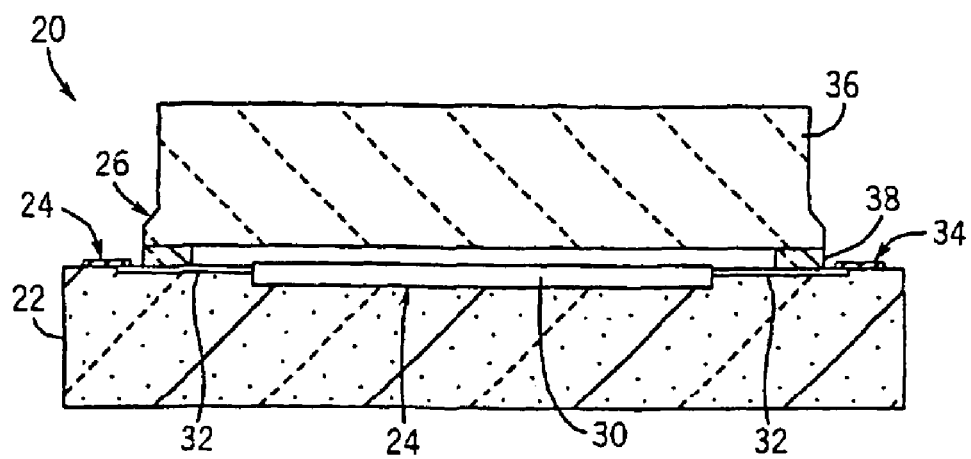
FIG. 1 is a sectional view of an example of micro device die fabricated according to one exemplary embodiment of a packaging and singulation method of the present invention.

FIG. 1 is a sectional view of a completed micro device die 20 fabricated according to one embodiment of the present invention. Micro device die 20 includes device substrate 22, micro device 24 and protective single device lid 26. Substrate 22 serves as a base or foundation for micro device 24. In the particular embodiment illustrated, substrate 22 generally comprises a layer of silicon. In alternative embodiments, substrate 22 may be provided by one or more alternative materials formed in one or more layers.

Micro device 24 is supported by substrate 22 and includes main portion 30, communication leads 32 and contact points 34. Main portion 30 generally comprises the main operating components of device 24 that are protected by protective single device lid 26. In the particular embodiments illustrated, micro device 24 comprises a micro machine. Main portion 30 includes those moving portions of the micro machine. For example, in one specific embodiment, micro device 24 comprises a defractive light device (DLD) or a digital mirror device (DMD), wherein main portion 30 includes a movable mirror. In alternative embodiments, micro device 24 may comprise other forms of micro machines or may alternatively comprise micro electronics, wherein main portion 30 has alternative configurations.

Communication leads 32 generally extend from main portion 30 between substrate 22 and protective single device lid 26. Leads 32 facilitate communication between contact points 34 and main portion 30. Contact points 34 generally comprise ports or locations connected to leads 32 and positioned on substrate 22 outwardly beyond protective single device lid 26. Points 34 facilitate communication with main portion 30 while main portion 30 is protected or sealed by single device lid 26. In the particular embodiment illustrated, points 34 comprise pads formed from electrically conductive material which are conductively connected to leads 32 which are also formed from electrically conductive material. Points 34 and leads 32 enable electrical signals or voltages to be transmitted to main portion 30 of device 24. In alternative embodiments, leads 32 and points 34 may comprise other means for communicating with main portion 30 while main portion 30 remains protected by system 26. In still other embodiments, lead 32 and contact points 34 enable main portion 30 to communicate with surrounding environment. For example, lead 32 and contact 34 may be configured to react to the environment in a predetermined fashion, enabling main portion 30 to function as a sensor or to respond to the surrounding environment. For example, in one embodiment, lead 32 and contact 34 may be thermally conductive to conduct heat from the surrounding environment to main portion 30.

Protective single device lid 26 protects main portion 30 from environmental damage. Single device lid 26 includes single lid substrate 36 and seal 38. Lid substrate 36 generally comprises an imperforate covering member coupled to device substrate 22 such that main portion 30 of micro device 24 is protected between substrate 22 and single lid substrate 36. For purposes of the disclosure, the term coupled shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. In the particular embodiment illustrated, single lid substrate 36 is indirectly coupled to substrate 22 by seal 38. In alternative embodiments, single lid substrate 36 may be directly coupled to substrate 22. Single lid substrate 36 is formed from silicon or non-silicon materials. In the particular embodiment illustrated in which each micro device 24 comprises a DLD, single lid substrate 36 is formed from one or more at least partially transparent materials. In one embodiment, single lid substrate 36 is formed from glass. In other embodiments, single lid substrate 36 is formed from such materials as kovar, ceramics, liquid crystal polymers and the like.

Seal 38 generally comprises a structure coupled between substrate 22 and single lid substrate 36 so as to form a seal about main portion 30. In the particular embodiment illustrated, seal 38 hermetically seals main portion 30. In one embodiment, seal 38 comprises a bond ring formed from material such as glass frit, gold tin (AuSn) or other materials extending completely about main portion 30 so as to space single lid substrate 36 from main portion 30. In one embodiment, seal 38 is first coupled to single lid substrate 36 and is then coupled to substrate 22. In another embodiment, seal 38 is first coupled to substrate 22 prior to single lid substrate 36 being coupled to substrate 22. In other embodiments, seal 38 may be integrally formed as a single unitary body with single lid substrate 36 or as part of substrate 22. In still other embodiments, single lid substrate 36 may be directly coupled to substrate 22 without seal 38.

Figure 2:
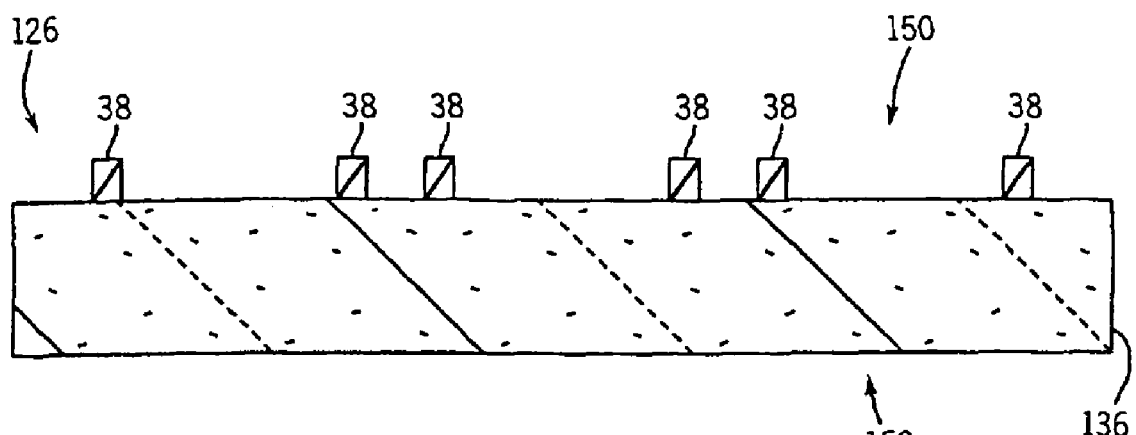
FIG. 2 is a sectional view of the formation of seals on a multi-lid substrate according to an exemplary embodiment.
Figure 3:
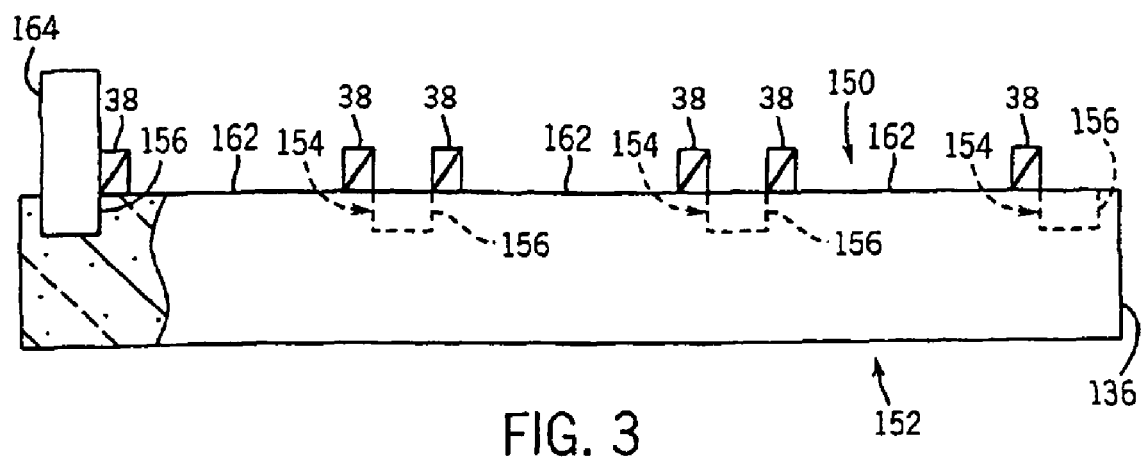
FIG. 3 is a sectional view illustrating the formation of a trench pattern in the multi-lid substrate to form a protective multi-device lid according to an exemplary embodiment.
Figure 4:
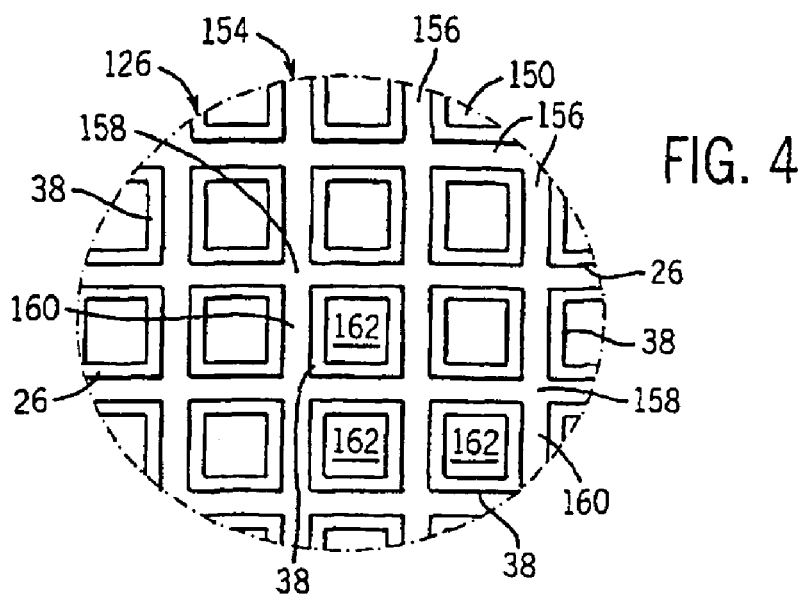
FIG. 4 is a top plan view of the protective multi-device lid of FIG. 3 according to an exemplary embodiment.
Figure 5:
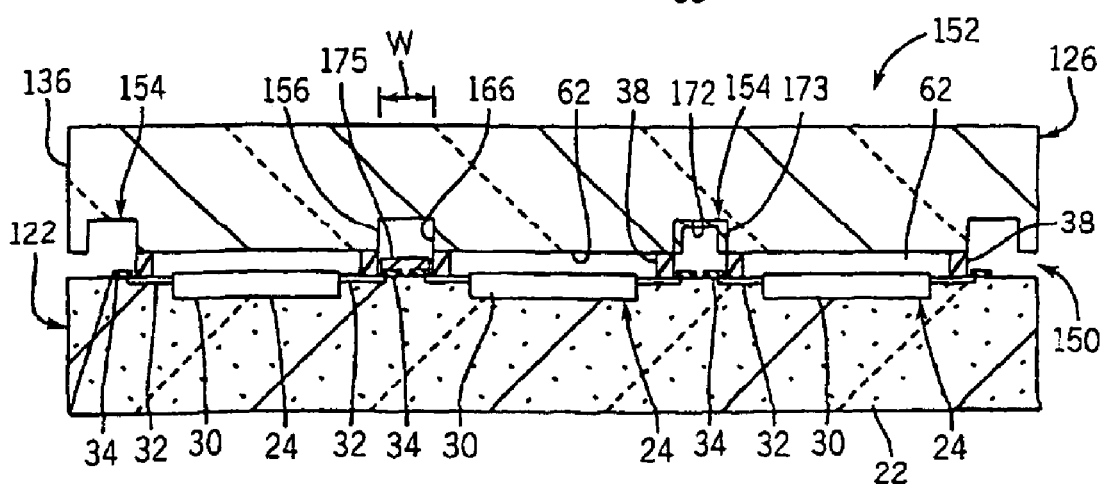
FIG. 5 is a sectional view illustrating the protective multi-device lid of FIG. 4 coupled to a micro device wafer according to an exemplary embodiment.
Figure 6:
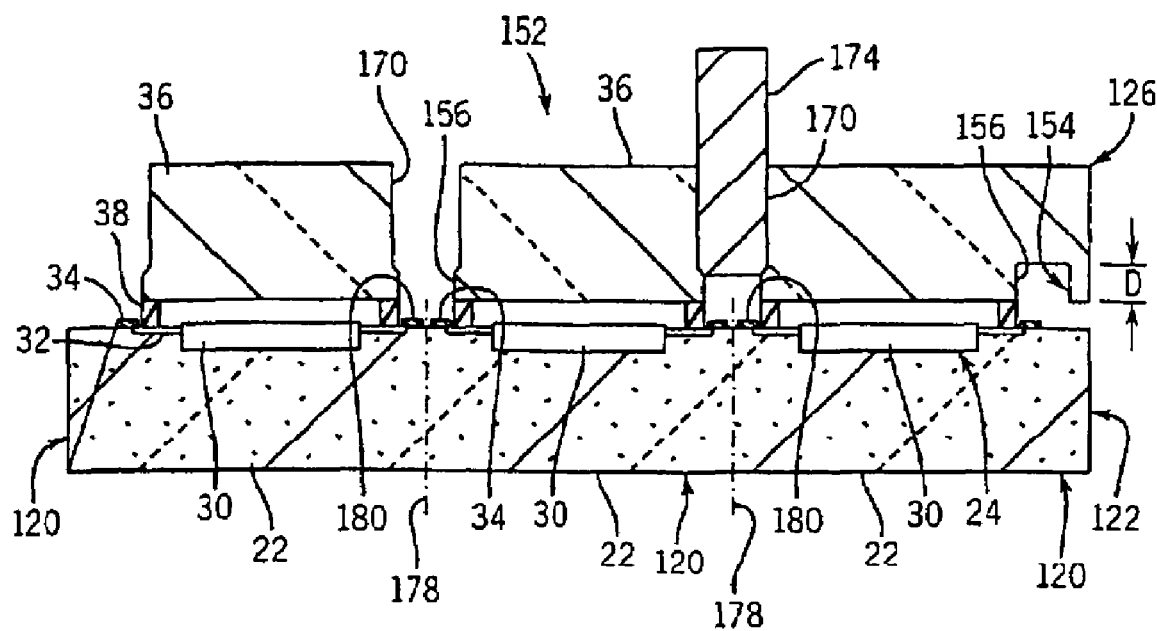
FIG. 6 is a sectional view illustrating the formation of access channels through the protective multi-device lid of FIG. 5 prior to singulation of the micro device wafer of FIG. 5 into individual dies according to an exemplary embodiment.

FIGS. 2–7 illustrate an exemplary method for fabricating a plurality of micro device dies 20 from larger wafers. FIG. 4 illustrates protective multi-device lid 126 which provides a plurality of lids 26. FIG. 5 illustrates the protective multi-device lid 126 coupled to a micro device wafer 122 which provides a plurality of interconnected substrates 22 supporting a plurality of micro devices 24. FIG. 6 further illustrates the joined micro device wafer 122 and protective multi-device lid 126 being singulated into individual micro device dies 120. FIGS. 2-4 illustrate the fabrication of protective multi-device lid 126. As shown by FIG. 2, multi-device lid 126 is initially formed from a multi-lid substrate 136 formed from the one or more materials from which lid substrate 36 is made. Multi-lid substrate 136 has a dimension such that multi-lid substrate 136 provides a plurality of lids 36 for protecting a plurality of micro devices of a micro device wafer 122 (shown in FIG. 5). Multi-lid substrate 136 has a first side 150 and a second opposite side 152. As shown by FIGS. 2 and 4, protective multi-device lid 126 includes seals 38. Seals 38 are generally formed along surface 150. Seals 38 may be bonded to surface 150 or may be formed upon surface 150. Seals 38 may be formed utilizing masking and/or photolithographic techniques. In lieu of seals 38 being formed by bonding or depositing one or more materials to surface 150, seals 38 may alternatively be formed by removing material from side 150.

In the particular embodiment illustrated, seals 38 comprise bond rings. Seals 38 are generally formed by photolithography techniques upon multi-lid substrate 136. According to one method, a layer of adhesive material, such as 500 angstroms of titanium tungsten, is deposited upon surface 150 of substrate 136. Thereafter, sealing material is deposited upon the layer of adhesive. As noted above, in one embodiment, gold tin (AuSn) or other materials may be used as a sealing material. A layer of photo resist is then patterned on the sealing material and a chemical etching process is performed to remove portions of the sealing material and the adhesive material upon surface 150 to create seals 38.

Figure 7:
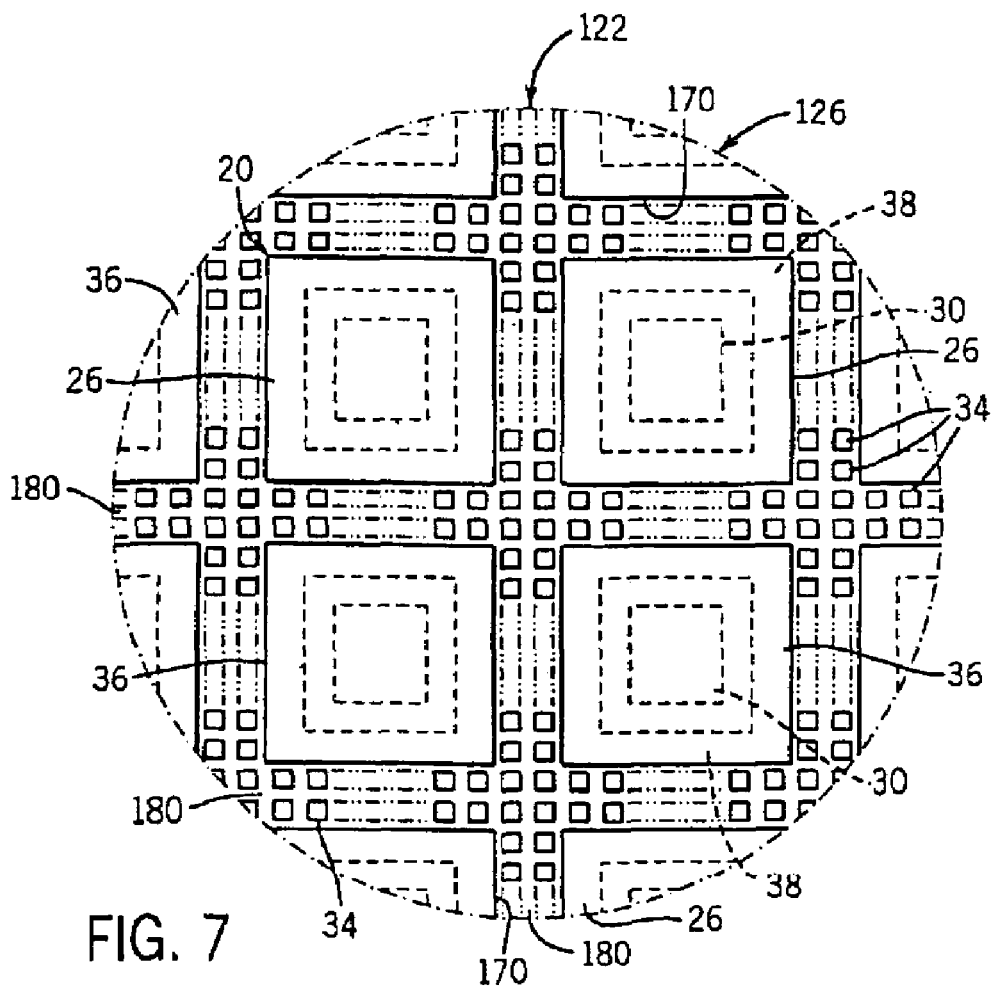
FIG. 7 is a top plan view of the joined protective multi-device lid and micro device wafer of FIG. 6 after the formation of the access channels according to an exemplary embodiment.

In other embodiments, seals 38 may be formed upon surface 150 using other techniques. In lieu of being formed on surface 150, seals 38 may be separately formed and collectively or individually mounted to surface 150. In other embodiments, seals 38 may comprise other sealing structures that may or may not join individual lids 36 to substrate 22 in addition to sealing about main portion 30 of each micro device 24 (shown in FIG. 1). Although seals 38 are illustrated as being generally rectangular or square, seal rings 38 may alternatively have other shapes depending upon the size and shape of main portion 30 of micro device 24 that must be protected. Although protective multi-device lid 126 is illustrated as having seals 38 coupled to multi-lid substrate 136, protective multi-device lid 126 may alternatively omit seals 38, wherein seals 38 are coupled to micro device wafer 122 (in locations such as shown in FIGS. 5, and 7) prior to protective multi-device lid 126 being coupled to micro device wafer 122.

As shown by FIG. 4, multi-lid substrate 136 further includes a trench pattern 154 along side 150. As shown by FIG. 3, trench pattern 154 comprises a multitude of individual trenches 156 which extend into wafer 136 from side 150 toward side 152. Trenches 156 are generally linear and intersect one another such that trench pattern 154 includes intersection portions 158 and non-intersection portions 160. Intersection portions 158 are those locations or areas along surface 150 where trenches 154 intersect or overlap one another. Non-intersection portions 160 are those locations or areas along surface 150 where trenches 156 do not overlap or intersect with one another.

Figure 4A:
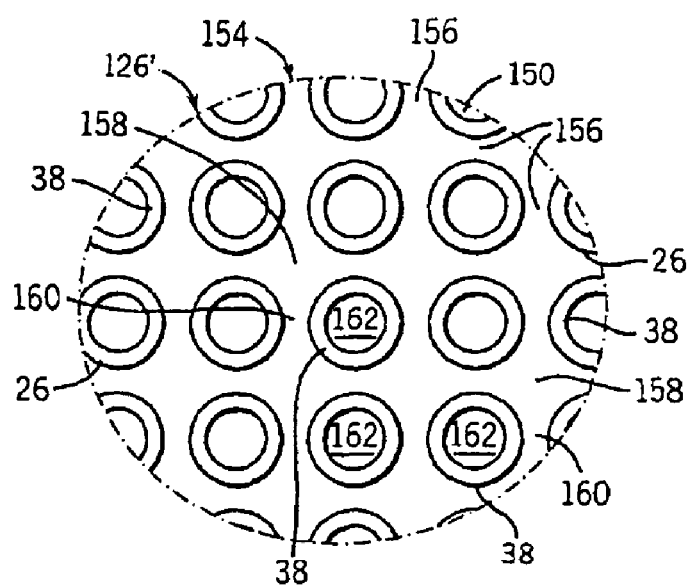
FIG. 4A is a top plan view of another exemplary embodiment of the protective multi-device lid of FIG. 4.

As further shown by FIG. 4, intersection portions 158 and non-intersection portions 160 of trench pattern 154 form a plurality of raised portions 162 along surface 150. Each raised portion 162 is dimensioned so as to completely extend across an opposite main portion 30 of a micro device 24 (shown in FIG. 1) when protective multi-device lid 126 is coupled to micro device wafer 122 with side 150 facing micro device wafer 122. Intersection portions 158 of trench pattern 154 are located and sized such that each intersection portion 158 extends adjacent to at least two micro devices 24 of micro device wafer 122 when protection multi-device lid 126 is coupled to micro device wafer 122. In particular applications, intersection portions 158 extend adjacent to at least three and nominally four micro devices 24. At the same time, non-intersection portions 160 of trench pattern 154 are located and dimensioned such that only a single non-intersection portion 160 extends between consecutive micro devices 24 of micro device wafer 122 when protection multi-device lid 126 is coupled to micro device wafer 122. As will be described in greater detail hereafter, this overall configuration of trench pattern 154 facilitates improved packaging and easier singulation of micro device wafer 122. Although trench pattern 154 is illustrated as being formed from a plurality of linear trenches that intersect one another such that raised portions 162 extend along surface 150 in a checkerboard pattern, trenches 156 may alternatively consist of non-linear trenches such that trench pattern 154 has other overall patterns along surface 150. FIG. 4A illustrates multi-device lid 126' in which trench pattern 154 is nonlinear and in which seals 38 have nonlinear sides.

As shown by FIG. 3, in one embodiment, trench pattern 154 is formed by removing material from surface 150 of multi-lid substrate 136. In one application, the material is removed by cutting. In one specific application, the material is removed by sawing trenches 156 into surface 150. For example, FIG. 3 illustrates a single saw blade 164 sawing into surface 150 so as to form trench 156. In other embodiments, multiple side-by-side saw blades may be utilized to form trenches 156 or one or more saw blades may take multiple passes along surface 150 to create a single trench 156. Because trenches 156 are formed by sawing material from surface 150, multi-lid substrate 136 and the resulting lids 36 may be formed from a wide variety of materials including non-silicon materials such as glass.

In other embodiments, trenches 156 may be formed by removing material from surface 150 using other techniques. For example, depending upon the material or materials from which multi-lid substrate 136 is formed, trenches 156 may be formed by removing material using various photolithographic techniques such as wet or dry etching. In one embodiment, trenches 156 may be formed by using deep reactive ion etching (DRIE). In other embodiments, trenches 156 may be formed by sand drilling, laser cutting or the use of a water jet. In still other embodiments, trenches 156 may be formed as part of multi-lid substrate 136 when multi-lid substrate 136 is initially molded or cast such that material does not need to be removed from surface 150 to form trenches 156. In still another embodiment, in lieu of being formed by removing material from surface or side 150, trenches 156 may be formed by adding or depositing material to side 150 about trenches 156 to form raised portions 162. In still other embodiments, combinations of the above-noted techniques may be employed to form trenches 156. Although trenches 156 are illustrated as being formed after formation of seals 38 upon surface 150, trenches 156 may alternatively be formed before the formation of seals 38 upon surface 150.

FIG. 5 illustrates protective multi-device lid 126 coupled to micro device wafer 122. As shown by FIG. 5, raised portions 62 extend opposite and beyond main portions 30 of micro devices 24. Seals 38 extend from multi-lid substrate 136 and extend across multiple communication leads 32 and generally between main portion 30 and proximate portions of trench pattern 154. Trenches 156 forming non-intersection portions 160 of trench pattern 154 generally have a width W so as to form an opening 166 sufficiently wide so as to extend opposite the contact points of two consecutive micro devices 24. As a result, once communication with trench pattern 154 is established from side 152, contact points 34 of consecutive micro devices 24 are simultaneously exposed. In the particular embodiment illustrated, non-intersection portions 160 have a width W of at least about 50 micrometers. In one embodiment, non-intersection portions 160 have a maximum width of about 2000 micrometers.

FIG. 6 illustrates the joined micro device wafer 122 and protective multi-device lid 126 being singulated into individual micro device dies 20. As shown by FIG. 6, portions of multi-lid substrate 136 between side 152 and trench 156 are removed to form access channels 170. In particular, starting at side 152 generally opposite contact points 34, material from multi-lid substrate 136 is removed until sufficient depth is attained so as to remove floor 172 (shown in FIG. 5) of trench 156. In one particular embodiment, each access channel 170 has a greater width than width W of trench 156 which results in improved access to contact points 34. In alternative applications, each access channel 170 has width substantially equal to or even less than the width W of trenches 156.

In the embodiment illustrated, the portions of multi-lid substrate 136 are removed in a manner such that the material between the resulting lids 36 does not fall onto or damage contact points 34. In one embodiment, the portions of multi-lid substrate 136 are removed by cutting into and through multi-lid substrate 136 such that the material being removed is substantially reduced in size and weight and is substantially forced away from contact point 34. In one embodiment, the portions of multi-lid substrate 136 opposite trenches 156 are removed by sawing. FIG. 6 illustrates a saw blade 174 sawing through multi-lid substrate 136 to a depth so as to connect with trench 156. Although a single saw blade 174 is illustrated, multiple side-by-side saw blades may alternatively be used to saw multi-lid substrate 136 to provide open communication with trenches 156. To further prevent possible damage to contact points 34 during the removal of the material to form the channels 170, a protective material may be provided between floors 172 and one or more of contact points 34. For example, in one embodiment, trenches 156 may be backfilled such that floors 172 are coated with a protective material 173 (shown in FIG. 5) such as polyvinylacetate (PVA). Protective material 173 is removed as access channels 170 (shown in FIG. 6) are formed. This coating protects contact points 34 from saw chipping. In other embodiments, protective material 175 (shown in FIG. 5) may be deposited upon contact points 34 prior to sawing to protect contact points from damage due to saw chipping. In particular applications, protective material 175 may be removed once access channels 170 (shown in FIG. 6) are formed. In other embodiments, multiple saw cuts may be employed to form a desired trench width or depth. In other embodiments, such protective coating or filling may be omitted.

Trenches 156 have a depth D sufficient such that saw blade or blades 174 may be used to saw portions of multi-lid substrate 136 adjacent to trenches 156 without the risk of the saw blade or the material fragments created by saw blade 174 accidentally damaging contact points 34. In the particular embodiment illustrated, each trench 156 has a depth D of at least 15 micrometers. Trenches 156 have a maximum depth D of about 300 micrometers. A maximum depth D of trenches 156 may be increased or decreased depending upon the thickness of multi-lid substrate 136. In alternative embodiments where other means are used for removing portions of multi-lid substrate 136, the depth D of trenches 156 may be modified.

FIG. 7 illustrates the joined micro device wafer 122 and protective multi-device lid 126 after portions of multi-lid substrate 136 opposite trench pattern 154 have been removed. As shown by FIG. 7, the formation of access channels 170 within multi-lid substrate 136 divides protective multi-device lid 126 into a plurality of distinct die packages 26 including individual lids 36 and the underlying seals 38. At the same time, multiple contact points 34 along all sides of main portions 30 of micro devices 24 and along all sides of the resulting lids 36 are simultaneously exposed. In the particular embodiment illustrated in which trench pattern 154 includes multiple linear trenches 156 that intersect one another, each pass of one or more saw blades across side 152 of multi-lid substrate 136 exposes contact points 34 along sides of multiple micro devices 24. As a result, manufacturing costs and complexity are reduced while overall packaging yield is improved.

Once those portions of multi-lid substrate 136 opposite trenches 156 are removed to form access channels 170, micro device wafer 122 is separated into distinct die substrates 22 which results in the individual micro device dies such shown in FIG. 1. As shown by FIG. 6, micro device wafer 122 is generally separated into individual dies along separation lines 178. Separation lines 178 generally extend between contact points 34 of consecutive micro devices 24. Separation lines 178 pass through that portion of passageway 180 which extended opposite trench 156. Because of the spacings between lids 36 provided by trenches 156 and access channels 170, separation of micro device substrate 122 in individual dies along separation lines 178 is simplified and performed with greater control.

Overall, protective multi-device lid 126 and the disclosed method for packaging micro device wafer 122 achieve several advantages over conventionally known packaging methods. Because the packaging of the individual micro devices 24 is achieved while micro devices 24 are part of the micro device wafer, packaging costs are reduced. Because lids 36 and seals 38 are coupled to micro device wafer 122 as a multi-device lid, the packaging costs are even further reduced. At the same time, individual devices 24 are hermetically sealed and protected prior to multi-lid substrate 136 being separated into distinct lids 36 and prior to micro device wafer 122 being separated into distinct dies. Consequently, the overall package yield is improved.

Moreover, because trenches 156 create a natural buffer to protect contact points 34, a wide variety of techniques may be used to remove material from multi-lid substrate 136 and to form access channels 170. As a result, the selection of materials for multi-lid substrate 136 is not limited due to a specific required material removal technique. For example, the disclosed packaging and singulation method enables the material to be removed by sawing. This enables non-silicon materials, such as glass, kovar, ceramic, liquid crystal polymer and the like to be utilized for multi-lid substrate 136. The disclosed packaging and singulation method also allows contact points 34 to be exposed on all sides of micro device 24 without requiring complex techniques for exposing such points. In summary, the disclosed packaging and singulation method addresses the key requirements of low cost micro device packaging: (1) a wafer-level process, (2) high yield potential, (3) environmental control inside a hermetic package, (4) protection of the micro device during singulation and (5) exposed communication points around multiple sides of the die.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A multi-device lid for a micro device wafer having a plurality of micro devices, the multi-device lid comprising:
a multi-lid substrate configured to cover the plurality of micro devices of the micro device wafer, the multi-lid substrate having a trench pattern with intersection portions and non-Intersection portions on a first side of the multi-lid substrate, the intersection portions and non-intersection portions having a floor, wherein the trench pattern is configured such that the intersection portions of the trench pattern extend adjacent to at least two of the plurality of micro devices when the multi-lid substrate is coupled to the micro device wafer; and
a protective material coupled to the multi-lid substrate within the non-intersection portions of the trench pattern and opposite the floor of the non-intersection portions.

2. The multi-device lid of claim 1, wherein the trench pattern is configured such that only a single non-intersection trench portion extends between consecutive micro devices of the micro device wafer when the multi-lid substrate is coupled to the micro device wafer.

3. The multi-device lid of claim 1, wherein each micro device includes a main portion and a contact point projecting from the main portion, wherein the non-intersection portions of the trench pattern have a width forming an opening such that the opening extends adjacent to at least one contact point of at least one device when the multi-device lid is coupled to the micro device wafer.

4. The lid of claim 3, wherein the opening is configured to extend adjacent a first contact point of a first micro device and a second contact point of a consecutive second micro device of the micro device wafer when the multi-device lid is coupled to the micro device wafer.

5. The lid of claim 3, wherein each micro device has a plurality of contact points projecting from the main portion and wherein the opening is configured so as to extend adjacent the plurality of contact points when the multi-device lid is coupled to the micro device wafer.

6. The lid of claim 1, wherein each micro device has a main portion, a first contact point on a first side with the main portion and a second contact point on a second side of the main portion and wherein the trench pattern is configured to form openings adjacent the first contact point and the second contact point when the multi-device lid is coupled to the micro device wafer.

7. The lid of claim 1, wherein the multi-lid substrate is at least semi-transparent.

8. The lid of claim 1, wherein the multi-lid substrate is formed from glass.

9. The lid of claim 1, wherein the multi-lid substrate is formed from at least one non-silicon material.

10. The lid of claim 1 including a bond ring coupled to the multi-lid substrate and configured to form a seal between the multi-lid substrate and the micro device wafer when the multi-device lid is coupled to the micro device wafer.

11. The lid of claim 1, wherein the trench pattern includes a plurality of intersecting linear trenches.

12. The lid of claim 1, wherein the trench pattern includes a plurality of intersecting non-linear trenches.

13. The lid of claim 1, wherein the trench pattern includes trenches having a depth of at least 50 micrometers.

14. The lid of claim 1, wherein the trench pattern includes trenches having a width of at least about 50 micrometers.

15. The lid of claim 1 including a seal coupled to the multi-lid substrate along the trench pattern.

16. A multi-device lid for a micro device wafer having a micro device with a contact point, the multi-device lid comprising:
a multi-lid substrate configured to cover a micro device of the micro device wafer, the multi-lid substrate having a trench with a first side, a second side opposite the first side and a floor between the first side and the second side that is configured to extend opposite the contact point when the multi-lid substrate is coupled to the micro device wafer; and a protective material coupled to the multi-lid substrate within the trench and continuously extending from the first side to the second side opposite the floor, wherein the protective material is configured to extend opposite to the contact point when the multi-lid substrate is coupled to the micro device wafer.

17. The multi-device lid of claim 1, wherein the non-intersection portion of the trench pattern includes a first side and a second opposite side and wherein the protective material continuously extends from the first side to the second side opposite the floor.

18. The multi-device lid of claim 1, wherein the multi-lid substrate is configured such that the protective material is out of contact with any other structure when the multi-lid substrate is coupled to the micro device wafer.

19. The multi-device lid of claim 1, wherein the floor is at a depth such that the protective material is suspended above the micro device wafer when the multi-lid substrate is coupled to the micro device wafer.

20. The multi-device lid of claim 1, wherein the multi-lid substrate includes a continuous homogenous layer of non-conductive material extending across the floor.

21. The multi-device lid of claim 20, wherein the material comprises a non-silicon material.

22. A multi-device lid of claim 20, wherein the material comprises glass.

23. The multi-device lid of claim 1, wherein the floor is configured to extend opposite a contact point of the micro device wafer when the multi-lid substrate is coupled to the micro device wafer and wherein the multi-lid substrate includes a continuous homogenous layer of non-conductive material extending across the floor, the layer configured to extend opposite to the contact point when the multi-lid substrate is coupled to the micro device wafer.

24. The multi-device lid of claim 1, wherein the protective material is a dielectric material.

25. The multi-device lid of claim 1, wherein the protective material is a polymeric material.

26. The multi-device lid of claim 16, wherein the multi-lid substrate is configured such that the protective material is out of contact with any other structure when the multi-lid substrate is coupled to the micro device wafer.

27. The multi-device lid of claim 16, wherein the floor is at a depth such that the protective material is suspended above the micro device wafer when the multi-lid substrate is coupled to the micro device wafer.

28. The multi-device lid of claim 16, wherein the multi-lid substrate includes a continuous homogenous layer of non-conductive material extending across the floor.

29. The multi-device lid of claim 28, wherein the material comprises a non-silicon material.

30. The multi-device lid of claim 28, wherein the material comprises glass.

31. The multi-device lid of claim 16, wherein the floor is configured to extend opposite a contact point of the micro device wafer when the multi-lid substrate is coupled to the micro device wafer and wherein the multi-lid substrate includes a continuous homogenous layer of non-conductive material extending across the floor, the layer configured to extend opposite to the contact point when the multi-lid substrate is coupled to the micro device wafer.

32. The multi-device lid of claim 16, wherein the protective material is a dielectric material.

33. The multi-device lid of claim 16, wherein the protective material is a polymeric material.

34. The multi-device lid of claim 16, wherein the protective material is polyvinyl acetate.

35. The multi-device lid of claim 16, wherein the multi-lid substrate includes a continuous homogenous layer of material extending across the floor from the first side to the second side and wherein the layer is configured to extend opposite the contact point when a multi-lid substrate is coupled to the micro device wafer.

36. A multi-device lid for a micro device wafer having a plurality of micro devices, the multi-device lid comprising:

a multi-lid substrate configured to cover the plurality of micro devices of the micro device wafer, the multi-lid substrate having a trench pattern with intersection portions and non-intersection portions on a first side of the multi-lid substrate, the intersection portions and non-intersection portions having a floor, and a protective material coupled to the multi-lid substrate within the non-intersection portions of the trench pattern and opposite the floor of the non-intersection portions.

* * * * *

UNITED STATES PATENT AND TRADEMARK OFFICE
CERTIFICATE OF CORRECTION

| | | |
|---|---|---|
| PATENT NO. | : 7,196,410 B2 | Page 1 of 1 |
| APPLICATION NO. | : 11/340321 | |
| DATED | : March 27, 2007 | |
| INVENTOR(S) | : Chen et al. | |

It is certified that error appears in the above-identified patent and that said Letters Patent is hereby corrected as shown below:

In the Claims

Col. 8 (line 1), delete "non-Intersection" and insert therefor --non-intersection--.

Signed and Sealed this

Twenty-eighth Day of August, 2007

JON W. DUDAS
*Director of the United States Patent and Trademark Office*